Nov. 2, 1965 B. D. LOUGHLIN ETAL 3,215,947
INTERNALLY SYNCHRONIZED GATED CLOCK OSCILLATOR
Filed April 24, 1962
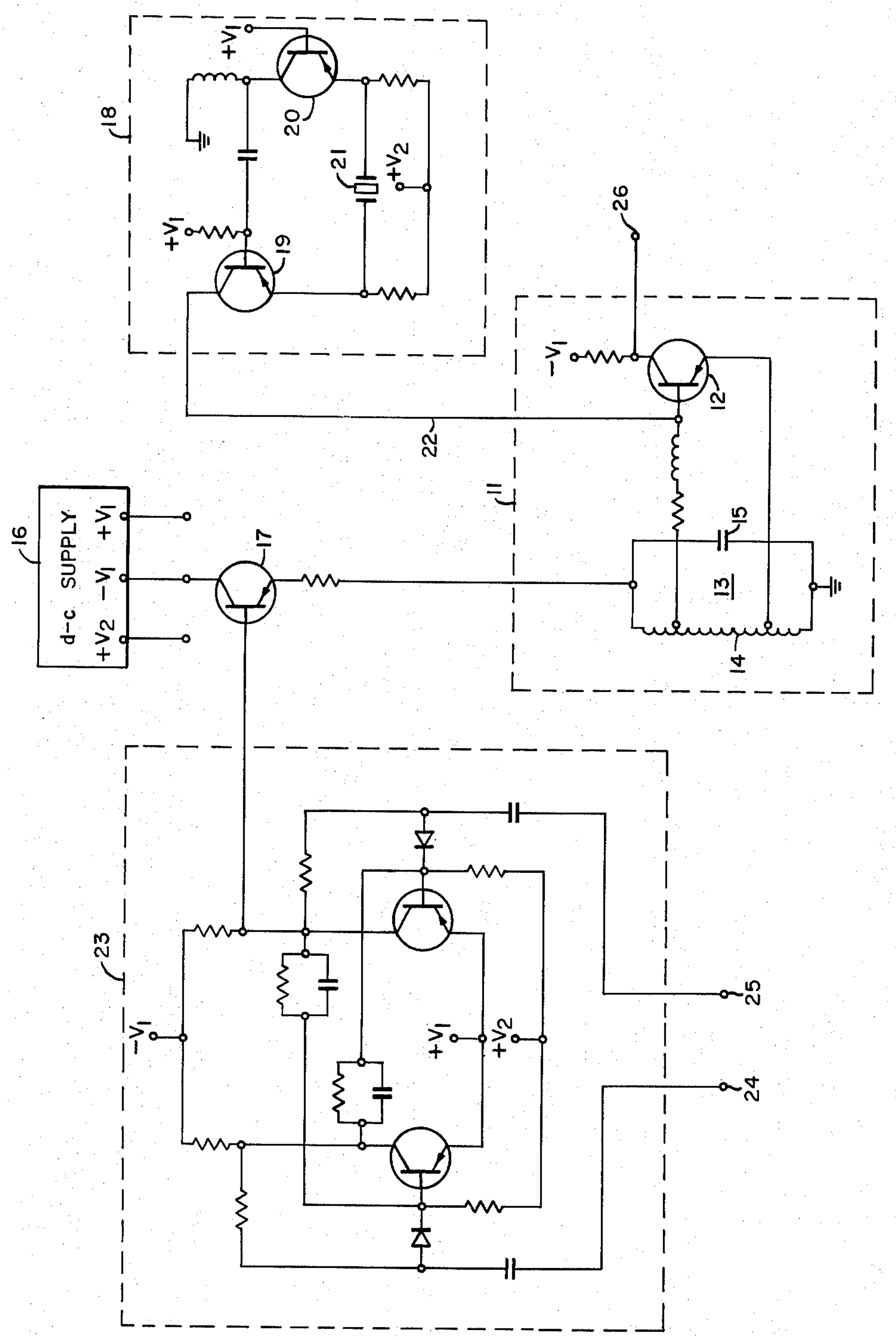

United States Patent Office 3,215,947
Patented Nov. 2, 1965

3,215,947
INTERNALLY-SYNCHRONIZED GATED CLOCK OSCILLATOR

Bernard D. Loughlin, Huntington, and Carl R. Wilhelmsen, Huntington Station, N.Y., assignors to Hazeltine Research, Inc., a corporation of Illinois Filed Apr. 24, 1962, Ser. No. 189,830
3 Claims. (Cl. 331—51)

This invention is concerned with an externally triggered, internally synchronized stable oscillator.

While the invention has general application, it will be described with reference to the problems of producing an accurate train of pulses which may, for example, be used to activate a digital shift register. Where a train of pulses are required for such a device, it is extremely important that every pulse (oscillation) in the train be a full amplitude, full cycle pulse. It is also necessary that the source of such a pulse train be immediately responsive to both "start" and "stop" random trigger signals.

It is well-known to either use a pulsed Hartley oscillator or a pulsed crystal oscillator to produce oscillations which are synchronized with a random trigger signal. However, in such well-known circuits, the amplitude of the first few cycles of oscillating may not be of the desired magnitude since a finite time is required before the resonant circuit or crystal, as the case may be, reaches the operating energy level. In order to initiate an oscillation (or train of pulses) with no transient, the magnitudes of the voltage and current in the oscillator energy storage circuit in the quiescent state (before oscillation) must simultaneously equal values which they will have at some instant during the steady state oscillations. If one merely wishes to produce a stable and accurately controlled oscillation, the normal practice is to utilize a crystal oscillator. However, where, as here, an additional requirement is imposed (every cycle a full amplitude cycle) the crystal oscillator inherently presents obstacles to the accomplishment of all the objectives. Connections to the equivalent impedances (L and C) of the crystal circuit are not physically accessible, making it difficult to produce the required relationship between voltage and current in such impedances in the quiescent state. As a result, the initial conditions for oscillation of the crystal cannot be controlled in the same manner as in the pulsed Hartley oscillator. Moreover, difficulties are encountered in attempting to stop the crystal oscillations precisely at the end of the required period.

It is therefore an object of the present invention to provide an oscillator which substantially avoids one or more of the limitations of the described prior arrangements.

It is a further object of the present invention to provide an oscillator which produces an externally triggered pulse train with the accuracy and stability of a crystal oscillator having no transients produced at either the beginning or end of oscillation.

It is a further object of the present invention to provide a stable oscillator for producing an accurate externally triggered pulse train utilizing transistors.

In accordance with the present invention an externally triggered, stable oscillator comprises a first transistor circuit including a parallel inductance-capacitance energy storage circuit for producing a first oscillatory signal in a controlled intermittent pattern; a multi-state transistor switching circuit including a D.-C. source and a transistor switching device for coupling the D.-C. source to the energy storage circuit in a first state of the switching device for providing a current to the energy storage circuit whose magnitude is equal to the maximum current occurring in the energy storage circuit when the first transistor circuit is oscillating, and for removing the D.-C. source from the energy storage circuit in a second state of the switching device. The stable oscillator further comprises a second transistor circuit coupled to the first transistor circuit for providing a second oscillatory signal whose frequency is a harmonic of the frequency of the first oscillatory signal, the second transistor circuit having better stability characteristics than the first transistor circuit and a source of triggering signals coupled to the switching device for changing the switching device from the first state to the second state upon a first triggering signal for initiating full cycle, full amplitude oscillations in the first transistor circuit in synchronism with the oscillatory signals produced by the second transistor circuit and for returning the switching device to the first state upon a second triggering signal for terminating oscillations in the first transistor circuit with an insignificant transient response produced.

For a better understanding of the present invention, together with other and further objects thereof, reference is had to the following description taken in connection with the accompanying drawing and the scope will be pointed out in the appended claims.

Referring to the drawing, an externally triggered stable oscillator constructed in accordance with the invention comprises, first electrical circuit means 11 for producing a first oscillatory signal. First electrical circuit means 11 includes transistor 12 and means for storing energy 13 such as the parallel combination of inductance 14 and capacitance 15. Transistor 12 and its associated elements are arranged in the Hartley oscillator configuration with the parameters chosen, for example, to produce oscillations at a frequency of 1 mc. First electrical circuit means 11 will hereinafter be referred to as Hartley oscillator 11.

The system further comprises means for supplying energy such as direct-current source 16 coupled to energy storage circuit 13 by means of transistor switching device 17, switching device 17 being in a conductive state when Hartley oscillator 11 is not oscillating. The direct-current supplied to energy storage circuit 13 during the non-oscillatory period is chosen equal to the maximum current which will occur in energy storage circuit 13 when Hartley oscillator 11 is oscillating.

The system further comprises second circuit means 18, including transistors 19 and 20 and crystal device 21 for producing a second oscillatory signal. Second oscillatory circuit means 18 is coupled via connection 22 to Hartley oscillator 11 and is arranged to oscillate at a frequency five times that of the first oscillatory signal (i.e. 5 mc.). Second oscillatory circuit means 18 is designed to have better stability characteristics (i.e. less drift due to thermal conditions, component aging and supply voltage fluctuations) than first oscillatory circuit means 11.

The system further comprises a means for conditioning first oscillatory circuit means 11 to render it responsive to the output of second oscillatory circuit means 18. This conditioning means may, for example, be a source of triggering signals 23 coupled to transistor switching device 17 and arranged to produce a signal of one polarity upon a first signal being applied to one of its input terminals 24 and to produce a triggering signal of a second polarity upon a second signal being applied to its other input terminal 25.

The system finally comprises output terminal 26 coupled to the collector of transistor 12 such that a train of pulses is derived from the system in a manner more fully described below.

*Operation*

As explained above an oscillator constructed in accordance with the invention may be used to produce an exact 1 mc. train of clock pulses with constant amplitude, the pulse train being started and stopped by an external random trigger. The system will first be considered during the period when no oscillations are produced at the output of Hartley oscillator 11. During this quiescent period, second oscillatory circuit means 18, hereinafter referred to as crystal oscillator 18, produces a continuous 5 mc. signal. The first oscillatory circuit means 11 (Hartley oscillator 11) does not respond to signals produced by crystal oscillator 18 since the bias voltages applied to transistor 12 are designed to maintain it in the nonconductive condition. During this period a steady D.-C. current is supplied by direct-current source 16 through "normally on" transistor switching device 17 to energy storage circuit 13, placing Hartley oscillator 11 in condition to begin oscillating and produce only full cycle, full amplitude oscillations.

Upon application of a "start" pulse to input terminal 24 of triggering signal source 23, a positive pulse is applied to the base of transistor 17 causing it to cease conduction. The voltage across energy storage circuit 13 starts increasing from zero in a positive direction at this time and subsequently varies sinusoidally. During the negative portion of the first cycle of oscillation produced by energy storage circuit 13, the combination of such oscillatory signal and the oscillatory signal produced by crystal oscillator 18 serves to drive transistor 12 into conduction during a portion of each cycle of the 1 mc. signal. A pulse output signal is thus produced at terminal 26. During succeeding cycles of oscillation of Hartley oscillator 11 the two signals applied to the base of transistor 12 lock in synchronism and the output pulses obtained al output terminal 26 appear at the rate of 1 mc. under the control of the 5 mc. crystal oscillator 18. As previously noted, a train of 1 mc. pulses having the stability of a crystal oscillator but starting as nearly as possible with a random trigger is required here. The 1 mc. train locks in with the nearest subharmonic of the 5 mc. signal so that a time error equal to or less than 0.1 $\mu$sec. results.

Upon application of a "stop" pulse to input terminal 25 of triggering signal source 23 a negative pulse is applied to the base of transistor 17, rendering it conductive and thereby once again supplying a direct-current to energy storage circuit 13 so as to terminate the oscillations produced by Hartley oscillator 11.

While there has been described what, at present, is considered to be the preferred embodiment of this invention, it will be obvious to those skilled in the art that various changes and modifications may be made therein without departing from the invention, and it is, therefore, aimed to cover all such changes and modifications as fall within the true spirit and scope of the invention.

What is claimed is:

1. An externally triggered stable oscillator comprising:

a first transistor circuit including a parallel inductance-capacitance energy storage circuit for producing a first oscillatory signal in a controlled intermittent pattern;

a multi-state transistor switching circuit including a D.-C. source and a transistor switching device for coupling said D.-C. source to the energy storage circuit in a first state of said switching device for providing a current to said energy storage circuit whose magnitude is equal to the maximum current occurring in said energy storage circuit when said first transistor circuit is oscillating, and for removing said D.-C. source from said energy storage circuit in a second state of said switching device;

a second transistor circuit coupled to said first transistor circuit for providing a second oscillatory signal whose frequency is a harmonic of the frequency of the first oscillatory signal, said second transistor circuit having better stability characteristics than said first transistor circuit, and a source of triggering signals coupled to said switching device for changing said switching device from said first state to said second state upon a first triggering signal for initiating full cycle, full amplitude oscillations in said first transistor circuit in synchronism with the oscillatory signals produced by said second transistor circuit and for returning said switching device to said first state upon a second triggering signal for terminating oscillations in said first transistor circuit with an insignificant transient response produced.

2. An externally triggered stable oscillator, comprising:

a first oscillatory circuit which includes a parallel inductance-capacitance energy storage circuit and a first transistor having an emitter, base and collector for producing a first oscillator signal in a controlled intermittent pattern;

a multi-state switching circuit including a second transistor having an emitter, base and collector and a D.-C. source coupled to the collector of said second transistor with the emitter of said second transistor coupled to said energy storage circuit for providing a current to said energy storage circuit when said second transistor is conducting, whose magnitude is equal to the maximum current occurring in said energy storage circuit when the first oscillatory circuit is oscillating, and for removing said D.-C. source from said energy storage circuit when said second transistor is not conducting;

a crystal controlled oscillator including a third transistor having an emitter, base and collector for providing a second oscillator signal whose frequency is a harmonic of the frequency of the first oscillatory signal, the collector of said third transistor being coupled to the base of said first transistor for synchronizing said first oscillatory signal with said second oscillatory signal;

and a source of triggering signals of alternately positive and negative polarity coupled to the base of said second transistor for controlling the conduction state of said transistor, a first triggering signal rendering said second transistor nonconductive for producing a full cycle, full amplitude, oscillation in said first oscillatory circuit in synchronism with the oscillatory signals produced by said second oscillatory circuit and a second triggering signal rendering said second transistor conductive for terminating oscillations in said first oscillatory circuit with an insignificant transient response produced.

3. An externally triggered stable oscillator as specified in claim 2 in which the collector of said first transistor provides an output consisting of a train of essentially equal amplitude constant frequency pulses beginning at said first triggering signal and ending at said second triggering signal.

References Cited by the Examiner

UNITED STATES PATENTS

| | | | |
|---|---|---|---|
| 2,248,481 | 7/41 | Schuttig | 331—55 X |
| 2,671,173 | 3/54 | Gammertsfelder | 331—166 X |
| 2,905,907 | 9/59 | Sanders | 331—173 |

FOREIGN PATENTS

| | | |
|---|---|---|
| 802,800 | 10/58 | Great Britain. |

OTHER REFERENCES

Bach: "A Frequency Divider Circuit," RCA Technical Notes, RCA TN No. 1 received U.S. Patent Office August 9, 1957.

ROY LAKE, *Primary Examiner.*